United States Patent
Komori et al.

(10) Patent No.: US 6,528,390 B2
(45) Date of Patent: Mar. 4, 2003

(54) PROCESS FOR FABRICATING A NON-VOLATILE MEMORY DEVICE

(75) Inventors: Hideki Komori, Aizuwakamatsu (JP); David K. Foote, San Jose, CA (US); Fei Wang, San Jose, CA (US); Bharath Rangarajan, Santa Clara, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/798,667

(22) Filed: Mar. 2, 2001

(65) Prior Publication Data

US 2002/0132446 A1 Sep. 19, 2002

(51) Int. Cl.$^7$ .................................................. H01L 21/76
(52) U.S. Cl. .................. 438/452; 438/439; 438/449; 438/450; 438/262
(58) Field of Search ...................... 438/439, 449, 438/450, 451, 452, 262

(56) References Cited

U.S. PATENT DOCUMENTS

| | | | | |
|---|---|---|---|---|
| 6,093,622 A | * | 7/2000 | Ahn et al. | 438/439 |
| 6,287,917 B1 | * | 9/2001 | Park et al. | 438/262 |
| 6,348,711 B1 | * | 2/2002 | Eitan | 257/316 |
| 6,358,761 B1 | * | 3/2002 | Yoo et al. | 438/14 |
| 6,362,052 B1 | * | 3/2002 | Rangarajan et al. | 438/262 |
| 6,387,752 B1 | * | 5/2002 | Sakao | 438/253 |
| 6,387,754 B2 | * | 5/2002 | Dalton et al. | 438/253 |

\* cited by examiner

*Primary Examiner*—Amir Zarabian
*Assistant Examiner*—Christy Novacek

(57) ABSTRACT

A method for fabricating a semiconductor structure includes growing regions of oxide on a first structure, to form bit-line regions; wherein said semiconductor structure includes a semiconducting substrate, a patterned ONO layer on said substrate, wherein said patterned ONO layer comprises regions of ONO and exposed regions of said semiconducting substrate, a patterned hard mask layer on said regions of ONO, and a patterned photoresist layer on said patterned hard mask layer.

16 Claims, 2 Drawing Sheets

PROCESS FOR FABRICATING A NON-VOLATILE MEMORY DEVICE

FIELD OF THE INVENTION

This invention relates to a process for fabricating semiconductor devices containing ONO layers.

BACKGROUND

Non-volatile memory devices are currently in widespread use in electronic components that require the retention of information when electrical power is terminated. Non-volatile memory designers have taken advantage of the ability of silicon nitride to store charge in localized regions and have designed memory circuits that utilize two regions of stored charge within an ONO (silicon oxide/silicon nitride/silicon oxide) layer. This type of non-volatile memory device is utilized for a two-bit EEPROM. Although an ONO layer has particular advantages in a non-volatile memory device, it may be useful in many other semiconductor devices.

While the recent advances in ONO technology have enabled memory designers to double the memory capacity of EEPROM arrays using two-bit data storage, numerous challenges exist in the fabrication of material layers within these devices. In particular, fabricating a bit-line oxide layer of consistent thickness between and across memory chips presents several challenges. Typically, in the fabrication of a memory cell, an ONO layer is formed having a first silicon dioxide layer overlying the semiconductor substrate, a silicon nitride layer overlying the first silicon dioxide layer; and a second silicon dioxide layer overlying the silicon nitride layer. A layer of photoresist is then spun on to the ONO layer. A photoresist is a light sensitive film that has four basic ingredients: polymers, solvents, sensitizers, and additives. The photoresist is patterned and the semiconductor substrate is doped through the opening in the pattern. The ONO layer is then patterned by etching, using the same pattern. Next, the photoresist mask is stripped and cleaned from the ONO layer and a bit-line oxide region is thermally grown onto the semiconductor substrate in the region where the ONO layer was etched.

There are several problems that occur with the above-described conventional method for fabricating a memory cell. One problem is that the ONO etch does not have good selectivity for silicon dioxide and can damage the semiconductor substrate. A second problem is that the ONO etch occurs at a rapid rate and it is difficult to estimate when the etching process should be terminated. If the ONO etch is carried out slightly longer than necessary, the semiconductor substrate could be damaged. The low selectivity to oxide and the rapid rate of the ONO etch process necessitates early termination of the ONO etching process. As a result, a layer of residual oxide overlying the semiconductor substrate remains after the ONO etch. The residual oxide layer has an inconsistent thickness. Thus the thickness of the resulting bit-line oxide region is also not consistent, due to the residual oxide layer. This inconsistent oxide region may result in inconsistent device properties.

BRIEF SUMMARY

In one aspect, the invention is a method of fabricating a semiconductor structure which includes forming an ONO layer, a hard mask layer, and a photoresist pattern on a semiconductor substrate in this order, patterning said hard mask layer and said ONO layer through etching so as to expose the surface of said semiconductor substrate, oxidizing the exposed surface of said semiconductor substrate by using said hard mask layer as an anti-oxidation mask, and thereby forming an oxide layer selectively on said exposed surface, implanting dopants into said semiconductor substrate through said oxide layer by using said hard mask layer as an anti-implantation mask, and thereby forming bit-line regions in said semiconductor substrate, and oxidizing the surface of said semiconductor substrate through said oxide layer by using said hard-mask layer as an anti-oxidation mask, and thereby forming a bit-line oxide layer on the surface of said semiconductor substrate.

In another aspect, the invention is a method of fabricating a semiconductor structure which includes forming a masking pattern on an ONO layer, wherein the ONO layer is on a semiconductor substrate; etching the ONO layer with the masking pattern as an etching mask forming exposed regions of semiconductor substrate; epitaxially re-growing stable oxide on said exposed regions of semiconductor substrate forming a bit-line region; forming pocket regions in the substrate with a hard mask as a doping mask; forming a bit-line oxide layer on the bit-line region; and removing the hard mask.

In yet another aspect, the invention is a semiconductor device which includes a semiconductor substrate, at least one patterned ONO layer on said substrate, and at least one bit-line oxide layer on said substrate. At least 99 percent of the bit-line oxide layer has a thickness that is at least 80 percent of the thickness of the thickest part of the bit-line oxide layer.

In still another aspect, the invention is a set of semiconductor devices that include a plurality of semiconductor substrates, a plurality of patterned ONO layers, on said substrates, and a plurality of bit-line oxide layers on said substrates. At least 99 percent of the bit-line oxide layers have a thickness that is at least 80 percent of the thickness of the thickest bit-line oxide layer.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

The present invention includes a process for fabricating a semiconductor device. The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication 3rd. edition, Peter Van Zant, McGraw-Hill, 1997.

In one aspect, a process for fabricating a semiconductor device includes providing a semiconductor substrate and forming an ONO layer over the semiconductor substrate. A patterned hard mask overlies the ONO layer and a patterned photoresist layer overlies the patterned hard mask. The semiconductor substrate is the underlying material upon which a device, circuit, or epitaxial layer is fabricated. The ONO layer is then completely removed with an ONO etch. After the ONO etch, the photoresist layer is stripped and a layer of stable oxide is re-grown by epitaxially re-growing stable oxide. The re-grown oxide layer has a consistent thickness that allows for forming a bit-line oxide layer of consistent thickness. The semiconductor substrate is then doped with dopants. After doping the semiconductor substrate, a bit-line oxide layer is grown on the semiconductor substrate. Compared to other processes, the resulting bit-line oxide layer is much closer to the desired thickness and is consistent between and across the semiconductor device. The thickness of the bit-line oxide layer between and across the semiconductor device is such that at least 99 percent of the bit-line oxide layers have a thickness that is at least 80 percent of the thickest bit-line oxide layer. Epitaxially re-growing the oxide layer after the ONO etch, allows for the fabrication of a memory cell with tighter critical dimensions and improved functionality.

Figure 1:
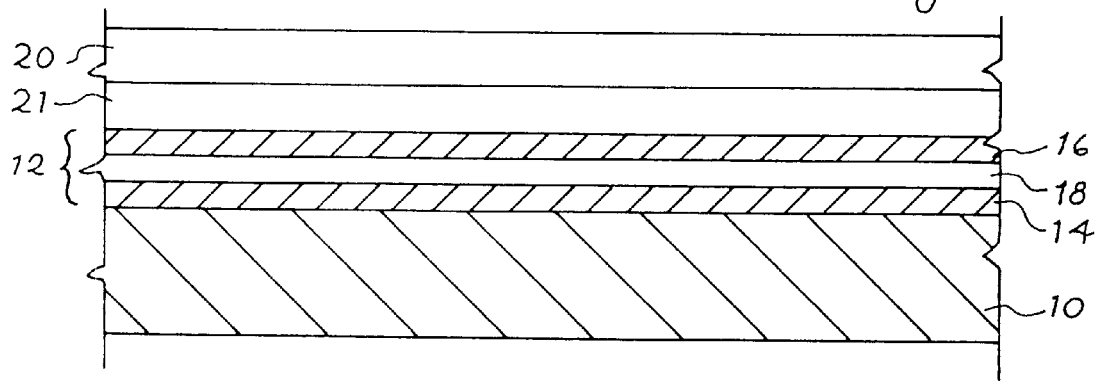
FIG. 1 illustrates, in cross section, a portion of a memory cell.

FIG. 1 shows a cross-section of a portion of a semiconductor structure substrate 10. An ONO layer 12 is on the semiconductor substrate 10 and includes a first oxide layer 14, a second oxide layer 16 and a silicon nitride layer 18 between the first oxide layer and second oxide layer. A hard mask 21 is on the ONO layer. The hard mask may be made of tungsten, titanium, titanium nitride, silicon nitride, or silicon oxynitride. A photo resist layer 20 is on the hard mask layer 21. The photo resist layer may be any type of resist, including optical photoresist responsive to physical and near UV light, deep UV resist, etc. Alternatively, the photo resist layer may be an inorganic resist layer or an X-ray resist layer.

Figure 2:
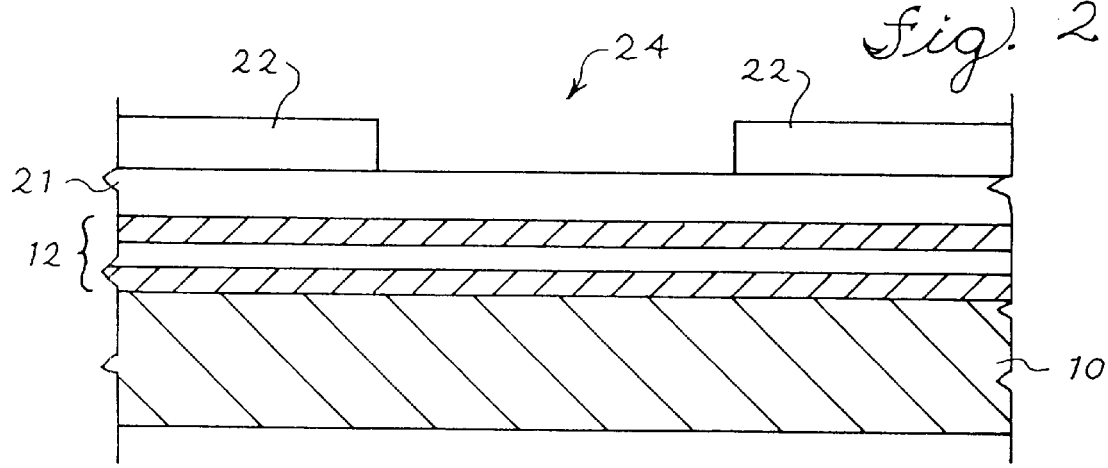
FIG. 2 illustrates, in cross section, a portion of a memory cell with a patterned layer.

Photo resist layer 20 is next exposed to radiation of the appropriate wavelength and developed to form a resist pattern 22 on the ONO layer 12, as illustrated in FIG. 2. The resist pattern exposes selected regions 24 of ONO layer 12.

Figure 3:
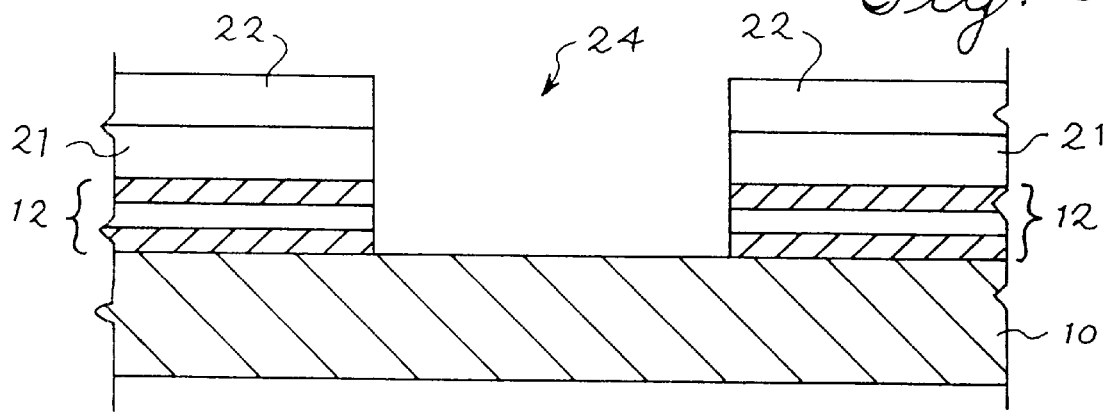
FIG. 3 illustrates, in cross section, a portion of a memory cell after an ONO etch process.

Referring to FIG. 3, portions of the ONO layer exposed through the resist pattern are completely etched. In a preferred embodiment, the ONO layer is anisotropically etched, so that the ONO layer and the resist pattern have continuous, substantially vertical, sidewalls.

Figure 4:
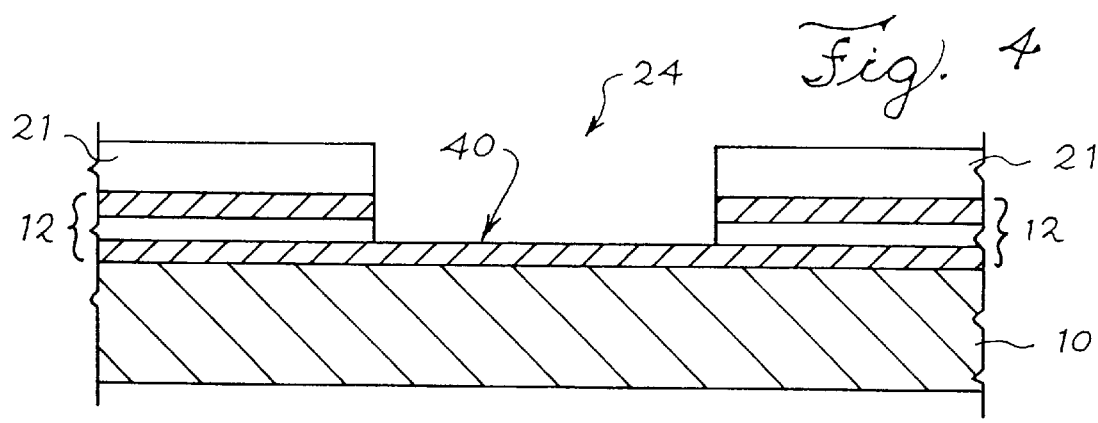
FIG. 4 illustrates, in cross section, a portion of a memory cell after re-growing stable oxide.

Referring to FIG. 4, the photo resist layer 22 is then stripped and a stable oxide layer 40 is epitaxially re-grown on the exposed regions 24 of semiconductor substrate 10. The re-grown stable oxide layer 40 is of consistent thickness since the epitaxially re-growing process can be controlled much more accurately compared to the etching process.

Figure 5:
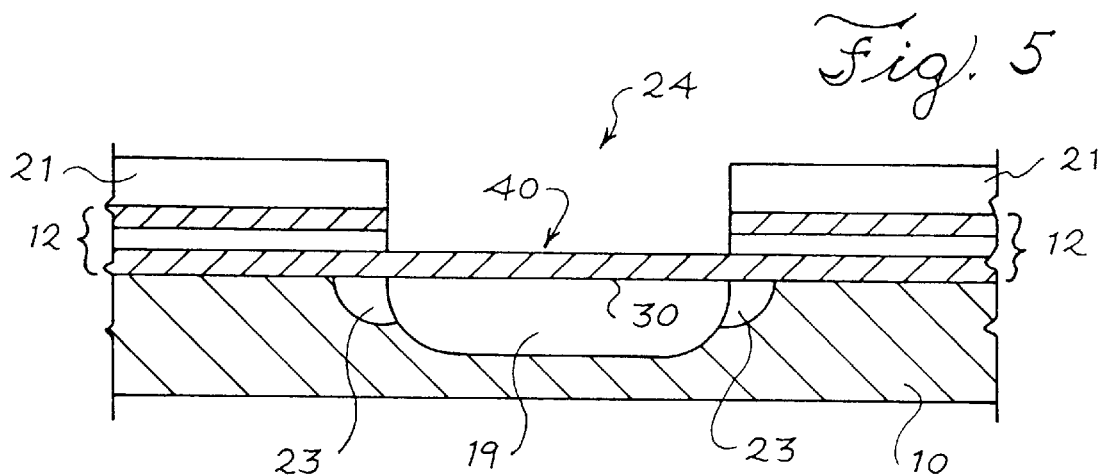
FIG. 5 illustrates, in cross section, a portion of a memory cell after a doping process.

A doping process is then carried out over exposed selected regions 24 to form doped regions, as illustrated in FIG. 5. Furthermore, in a preferred embodiment an n-type region 19 and p-type pocket regions 23 are formed. The doping process may be carried out before or after the ONO etch. Preferably, in this method the n-type region and the p-type pocket regions are formed after the ONO etch.

P-type pocket regions 23 are formed by doping semiconductor substrate 10 with a p-type dopant. Preferably, semiconductor substrate 10 is doped with a p-type dopant by ion implantation of boron. The ion implantation is preferably an angled implant, that is, an implant at an angle acute with respect to the principal surface 30 of semiconductor substrate 10. The angled implant process can be carried out at an angle of incidence of about 20 degrees to about 45 degrees depending upon the thickness and spacing of hard mask layer 21.

N-type region 19 is formed by ion implantation of an n-type dopant, such as arsenic, antimony, phosphorus, and the like. Alternatively, the semiconductor substrate 10 can be doped using molecular beam ion implantation or plasma assisted ion implantation. The ion implantation is preferably a direct ion implant performed at an angle substantially normal to principal surface 30 of semiconductor substrate 10.

Figure 6:
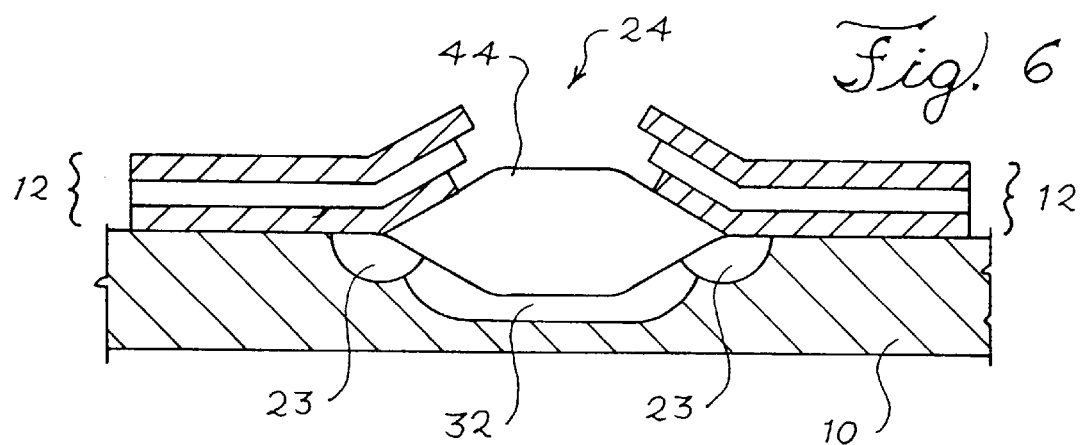
FIG. 6 illustrates, in cross section, a portion of a memory cell after formation of a bit-line oxide region.

After the doping process, a bit-line oxide layer 44 is formed. In a preferred embodiment, the bit-line oxide layer is formed by thermal oxidation of semiconductor substrate 10 using hard mask layer 21 as an oxidation mask. The ONO layer, having been previously patterned, exposes selected regions 24 of semiconductor substrate 10. During the preferred oxidation process, the patterned portions of the ONO layer prevent the oxidation of the semiconductor substrate in the region underlying the ONO layer. Accordingly, the bit-line oxide layer is confined to the selected regions of the semiconductor substrate. Upon completion of the oxidation process, the bit-line oxide layer is on bit-line region 32 in the semiconductor substrate, as illustrated in FIG. 6. As used herein, the term "regions" maybe one continuous region across the semiconductor substrate or multiple regions.

The resulting bit-line oxide layer 44 is of a consistent thickness and allows for a uniform amount of electrical charge to be carried between and across the semiconductor device. After forming the bit-line oxide layer 44, the hard mask layer 21 is removed. The hard mask layer 21 may be removed using a dry-etch process or a wet-etch solution, which are commonly known in the art. A wet-etch solution comprises hydrogen peroxide and other acid.

Since differences in the amount of charge carried by different cells affect the long-term functionality of a memory device, removing the ONO layer 12 completely and re-growing a stable layer of oxide 40 results in a semiconductor device with good critical dimensions control and long-term functionality.

The structure of the present invention may be incorporated into a semiconductor device such as an integrated circuit, for example a memory cell such as an SRAM, a DRAM, an EPROM, an EEPROM etc.; a programmable logic device; a data communications device; a clock generation device; electronic devices using semiconductors, automobiles, computers, and the like.

Numerous modifications and variations of the present invention are possible in light of the above teachings. For example, although the process described above describes doping after the ONO etch, the doping of the semiconductor substrate may be carried out before or after the ONO etch. It is therefore to be understood that within the scope of the appended claims, the invention may be practiced otherwise than as specifically described herein.

What is claimed is:

1. A method for fabricating a semiconductor device, comprising the steps of:
   a) forming an ONO layer, a hard mask layer, and a photoresist pattern on a semiconductor substrate in this order;

b) patterning said hard mask layer and said ONO layer through etching so as to expose a surface of said semiconductor substrate;

c) oxidizing the exposed surface of said semiconductor substrate by using said hard mask layer as an anti-oxidation mask, and thereby forming an oxide layer selectively on said exposed surface;

d) implanting dopants into said semiconductor substrate through said oxide layer by using said hard mask layer as an anti-implantation mask, and thereby forming a bit-line region in said semiconductor substrate; and e) oxidizing the surface of said semiconductor substrate through said oxide layer by using said hard-mask layer as an anti-oxidation mask.

2. The method of claim 1, wherein said forming of said oxide layer is by epitaxially growing stable oxide.

3. The method of claim 1, wherein said process of forming a bit-line oxide layer comprises thermal oxidation of the semiconductor substrate.

4. The method of claim 1, wherein said process further comprises, after forming said bit-line oxide layer:

removing the hard mask layer with a dry etch process.

5. The method of claim 1, wherein said hard mask comprises a material selected from the group consisting of tungsten, titanium, titanium nitride, silicon nitride and silicon oxynitride.

6. A method for fabricating a semiconductor structure comprising:

(i) forming a masking pattern on an ONO layer, wherein the ONO layer is on a semiconductor substrate;

(ii) etching the ONO layer with the masking pattern as an etching mask forming exposed regions of semiconductor substrate;

(iii) epitaxially growing stable oxide on said exposed regions of semiconductor substrate forming a bit-line region;

(iv) forming pocket regions in the substrate by using a hard mask layer as a doping mask, wherein said hard mask layer is on said ONO layer;

(v) forming a bit-line oxide layer on the bit-line region; and (vi) removing the hard mask.

7. The method of claim 6, wherein the method of removing the hard mask layer comprises using a dry-etch process or a wet-etch process.

8. The method of claim 7, wherein the method of removing the hard mask using a wet-etch process comprises using a solution of hydrogen peroxide and an acid.

9. The method of claim 6, wherein said hard mask comprises a material selected from the group consisting of tungsten, titanium, titanium nitride, silicon nitride and silicon oxynitride.

10. The method of claim 6, wherein the method of forming pocket regions comprises implanting a dopant at a tilt angle relative to a top surface of the semiconductor substrate.

11. The method of claim 6, wherein forming a bit-line oxide region comprises thermal oxidation of the semiconductor substrate.

12. The method of claim 6, wherein the semiconductor structure is a non-volatile flash memory structure.

13. The method of claim 6, further comprising forming a semiconductor device comprising said semiconductor structure.

14. The method of claim 13, further comprising making an electronic device comprising said semiconductor device.

15. The method of claim 6, further comprising forming a semiconductor device comprising said semiconductor structure.

16. The method of claim 15, further comprising making an electronic device comprising said semiconductor device.

* * * * *